(12) United States Patent
Peterson et al.

(10) Patent No.: US 8,747,591 B1
(45) Date of Patent: Jun. 10, 2014

(54) FULL TAPE THICKNESS FEATURE CONDUCTORS FOR EMI STRUCTURES

(75) Inventors: Kenneth A. Peterson, Albuquerque, NM (US); Richard T. Knudson, Los Lunas, NM (US); Frank R. Smith, Gardner, KS (US); Gregory Barner, Overland Park, KS (US)

(73) Assignee: Sandia Corporation, Albuquerque, NM (US)

( * ) Notice: Subject to any disclaimer, the term of this patent is extended or adjusted under 35 U.S.C. 154(b) by 271 days.

(21) Appl. No.: 12/833,262

(22) Filed: Jul. 9, 2010

Related U.S. Application Data

(60) Provisional application No. 61/244,650, filed on Sep. 22, 2009.

(51) Int. Cl.
  *C03B 29/00* (2006.01)
  *B29C 65/00* (2006.01)

(52) U.S. Cl.
  USPC ............. 156/89.12; 156/256; 156/257

(58) Field of Classification Search
  USPC ............... 156/89.12, 60, 256, 257
  See application file for complete search history.

(56) References Cited

U.S. PATENT DOCUMENTS

| | | | | |
|---|---|---|---|---|
| 5,426,404 A | * | 6/1995 | Kommrusch et al. | 333/246 |
| 5,461,196 A | * | 10/1995 | Virga et al. | 174/262 |
| 5,933,121 A | * | 8/1999 | Rainhart et al. | 343/873 |
| 6,072,375 A | * | 6/2000 | Adkins et al. | 333/1 |
| 6,114,925 A | * | 9/2000 | Lo | 333/185 |
| 6,233,422 B1 | * | 5/2001 | Abe et al. | 399/303 |
| 6,362,716 B1 | * | 3/2002 | Anbo et al. | 336/200 |
| 6,730,183 B2 | * | 5/2004 | Tokuda et al. | 156/89.12 |
| 6,965,161 B2 | * | 11/2005 | Jun et al. | 257/700 |
| 7,155,812 B1 | | 1/2007 | Peterson et al. | |
| 7,407,883 B2 | * | 8/2008 | Natarajan et al. | 438/652 |
| 7,494,557 B1 | | 2/2009 | Peterson | |
| 2003/0128096 A1 | * | 7/2003 | Mazzochette | 338/22 R |
| 2006/0197062 A1 | * | 9/2006 | Nakamura | 252/500 |

FOREIGN PATENT DOCUMENTS

JP 62212280 A * 9/1987

OTHER PUBLICATIONS

A. W. Doerry, "Performance Limits for Synthetic Aperture Radar—second edition", Sandia Report SAND2006-0821, Unlimited Release, Feb. 2006, pp. 1-70.

J. A. Johnston, Waveform design and Doppler sensitivity analysis for nonlinear Fm chirp pulses, IEE Proceedings F, vol. 133, No. 2, p. 163-175, Apr. 1986.

* cited by examiner

*Primary Examiner* — Philip Tucker
*Assistant Examiner* — Alex Efta
(74) *Attorney, Agent, or Firm* — Scott B. Stahl

(57) ABSTRACT

Generally annular full tape thickness conductors are formed in single or multiple tape layers, and then stacked to produce an annular solid conductive wall for enclosing an electromagnetic isolation cavity. The conductors may be formed using punch and fill operations, or by flowing conductor-containing material onto the tape edge surfaces that define the interior sidewalls of the cavity.

17 Claims, 4 Drawing Sheets

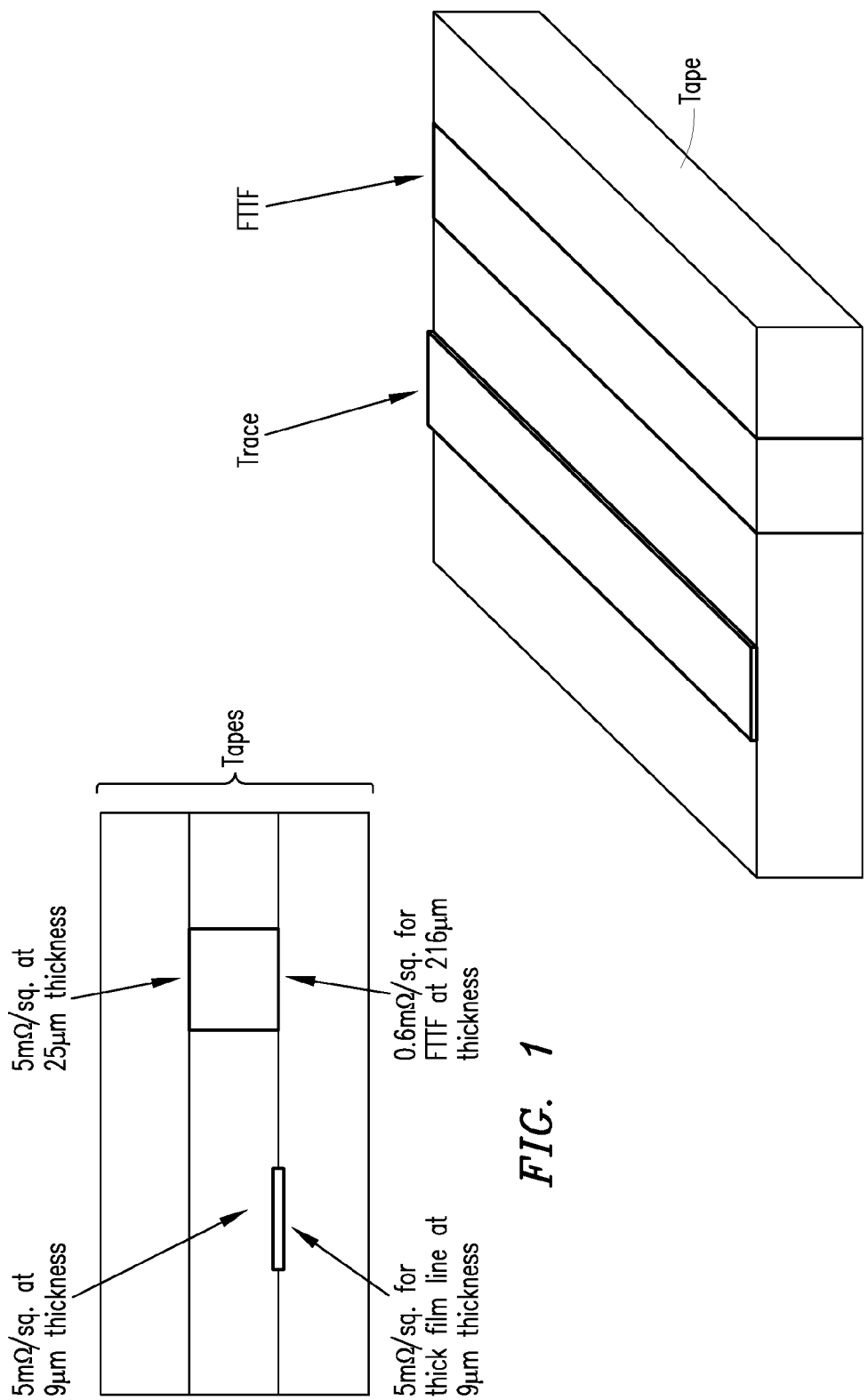

FULL TAPE THICKNESS FEATURE CONDUCTORS FOR EMI STRUCTURES

This application claims the priority under 35 U.S.C. §119 (e)(1) of provisional application Ser. No. 61/244,650 filed Sep. 22, 2009 and incorporated herein by reference.

This invention was developed under Contract DE-AC04-94AL85000 between Sandia Corporation and the U.S. Department of Energy and under Contract DE-AC04-01AL66850 between Honeywell FM&T and the U.S. Department of Energy. The U.S. Government has certain rights in this invention.

FIELD OF THE INVENTION

The invention relates generally to low temperature co-fired ceramics (LTCCs) and, more particularly, to providing EMI (electromagnetic isolation) structures in LTCCs.

BACKGROUND OF THE INVENTION

Applications for LTCC technology have been expanding as flat board technology has been augmented with three-dimensional features including cavities, channels, solid tubes, formed shapes, sacrificial volume materials (SVM) and various embedded components such as resistors, capacitors, inductors and heat sinks. See generally U.S. Pat. Nos. 7,494,557 and 7,155,812, both of which are incorporated herein by reference in their entirety.

Recently, techniques have been developed for fabricating continuous EMI full tape thickness features (FTTF). These are based on via fill technology and use the full thickness of the tape to improve performance. In the case of conductors, this is accomplished by substituting full thickness lines for surface-printed traces that are typically much thinner. FIG. 1 shows the increased cross-sectional thickness provided by FTTF as compared to a surface printed trace (designated as a thick film line feature in FIG. 1). FIG. 2 provides a perspective view of a tape having features similar to the middle tape in the stack of FIG. 1. As indicated in FIG. 1, the increased cross-sectional area results in correspondingly reduced resistivity. The result is paths with very low resistance. FTTF technology has also been used to produce fences for EMI structures that are superior to traditional via fences because of their ability to block more line-of-sight radiation.

It is desirable to provide for improvements in the use of FTTF technology in EMI structures.

BRIEF DESCRIPTION OF THE DRAWINGS

FIG. 1 is a cross-sectional view of a tape stack showing the contrast between a surface printed trace and FTTF.

FIG. 2 is a perspective view of a tape having features similar to the middle tape in the stack of FIG. 1.

DETAILED DESCRIPTION

EMI is increasingly important for critical transceiver circuits. Exemplary embodiments of the invention provide improved EMI structures using FTTF. Techniques are provided to produce EMI structures having generally annular, solid conductive walls comprising multiple stacked FTTF conductors, together with a conductive lid or intermediate conductive structure adjoining one end of the walls, and a ground plane adjoining the other end of the walls. The ground plane may be mesh or solid, although solid provides better isolation. The intermediate conductive structure may be, for example, a metal seal frame, a soldered layer, or a conductive-epoxy-attach layer. The solid walls provide improved isolation relative to other known approaches such as via fences and slot-style FTTF fences.

Slot-style FTTF fences use staggered layers of FTTF conductors (basically, laterally elongated versions of vias). Each layer has intervening tape dielectric between the conductors in that layer. The conductors in alternate layers are arranged in a staggered fashion, such that the intervening tape dielectric material of one layer does not contact the intervening dielectric material of the adjacent layers, but rather contacts conductors in the adjacent layers. Thus, the intervening dielectric material of each layer is surrounded by conductors in the slot-style FTTF fence. These conductor-surrounded dielectric portions constitute isolation "gaps" in the fence. The solid wall construction described herein provides continuous FTTF conductors in each layer of the wall, and thus eliminates the isolation gaps of the slot-style FTTF fence. The solid wall construction requires less material than the staggered slot-style FTTF fences and is on a par with staggered via fences, is more compact, and greatly reduces the amount of tape punching required.

Figure 3:
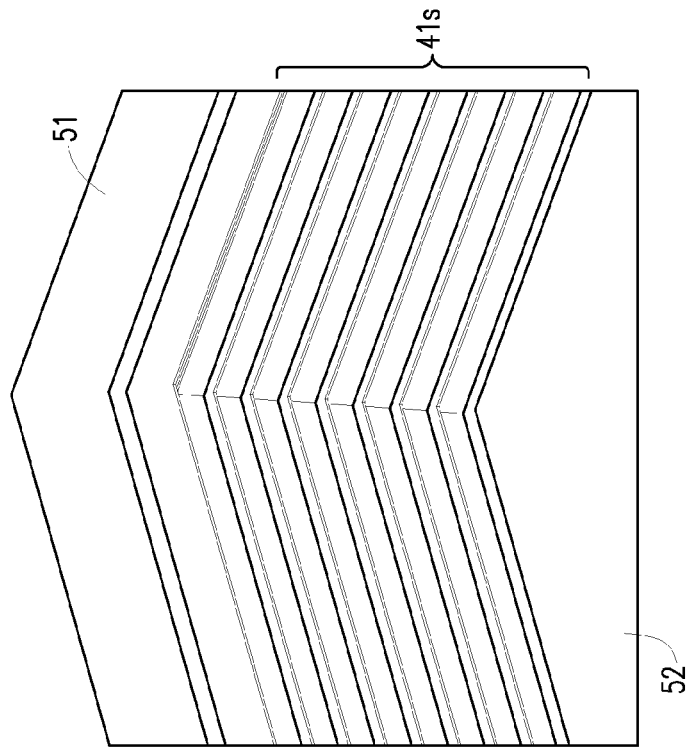
FIG. 3 diagrammatically illustrates a method of producing a solid wall conductive enclosure for EMI structures according to exemplary embodiments of the invention.

FIG. 3 diagrammatically illustrates a method of producing a solid wall Faraday enclosure for EMI according to exemplary embodiments of the invention. The wall is constructed of multiple layers of FTTF conductors stitched together in solid (continuous) annular configurations. The layers are produced in pairs as follows. In a step shown generally at 31, a lower tape layer 31A is punched at 31B, and the resulting trench portions are filled with thick film conductor material (e.g., conventional paste or ink) at 31C, by any suitable conventional method, such as screen printing, injection or stenciling. All fill operations shown and described herein are assumed to include drying the fill material. In FIG. 3, the punched and filled portions 31B/31C are separated by tethers that will be punched and filled later at 34. The tethers are retained so that the LTCC tape remains intact and does not detach completely from the tape layer.

In a step shown generally at 32, the upper tape layer 32A is punched at 32B to form further trench portions that have generally the same configuration as the corresponding trench portions 31B in the lower tape layer 31A, and are in laterally (inwardly in the example of FIG. 3) offset but overlapping relationship relative to the respectively corresponding filled portions 31C. Some embodiments provide the overlapping relationship but omit the lateral offset. Next, the trench portions 32B are filled with thick film material at 32C. In a step shown generally at 33, the layers 31 and 32 are then laminated.

In a step shown generally at 34, with the dried thick film material 31C and 32C and unpunched tethers available to support the inboard tape material, the tethers (between the already-filled trench portions) in layers 31A and 32A are removed by punching in a two-layer punch operation at 34A. The resulting trench portions are then filled with thick film material at 34B. In the example of FIG. 3, a larger punch is used at 34A than at 31B and 32B so that the aspect ratio will ease the subsequent filling, but various embodiments use smaller punch profiles than shown at 34A. This completes the annular solid wall portion for layers 31 and 32.

The steps 31-34 are repeated for as many tape layer pairs as desired. After all desired tape layer pairs are processed through steps 31-34, the processed pairs are collated and laminated to form a substrate containing an annular solid conductive wall. (Note that upper tape layers of the stack, including a portion of layer 32, are removed in the top view of FIG. 3 in order to illustrate completely the structure of a single, two-layer annular solid wall portion.) One or more layers will contain a conductive ground plane in a typical configuration. The laminated layers may then be modified by any post-processing called for by a particular design and fired as shown generally at 35 to produce an LTCC substrate.

Figure 4:
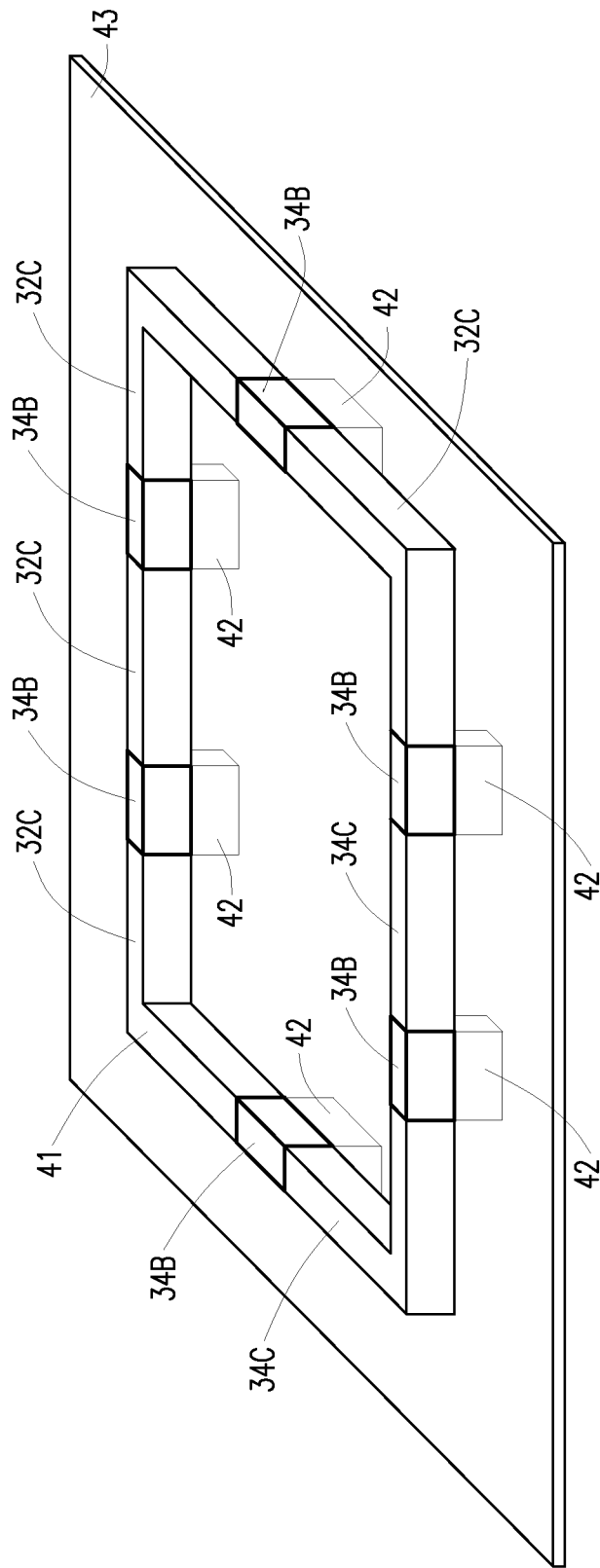
FIG. 4 diagrammatically illustrates other methods of producing a solid wall conductive enclosure for EMI structures according to exemplary embodiments of the invention.

Some embodiments process a single tape layer at a time, to produce a single layer solid conductive wall. The single layer is punched as, for example, in step 32 in FIG. 3 above, with tethers remaining between the punched trench portions. These trench portions are then filled as in step 32. With the dried thick film material deposited in the trench portions now available to support the inboard tape, the single layer tethers are punched and filled as above in step 34 (but for only the single layer here) to complete the single layer annular solid wall portion. (An example of such a single layer solid wall portion can be seen at 41 in FIG. 4, ignoring for the moment the extra, lower layer wall portions shown at 42 in FIG. 4.) The process is repeated for as many layers as desired, after which all of the single layer solid wall portions are collated and laminated to form a substrate containing an annular solid conductive wall. The laminated layers may then be fired to produce an LTCC substrate. In some embodiments, each of the aforementioned single tape layers is formed as a composite tape layer that includes at least two constituent tape layers. This composite tape layer structure provides more material strength for processing.

Some embodiments provide place the ground plane on a lower tape layer so that it is one tape layer below the surface of the circuit to be isolated. The presence of this lower tape layer permits more of the single layer wall portion to be punched into the adjacent upper tape layer in the initial punch operation, with smaller tethers than would otherwise be needed for the above-described single layer processing. The lower tape layer, which has the ground plane on its surface, is then laminated to the upper, punched tape layer. Note that the lower tape layer does not require cutouts aligned with the trench portions punched in the upper layer, and none are provided in some embodiments. A second, two-layer punch and fill operation (34B/42) is performed to complete the wall in the upper layer. The wall is two layers deep in those areas punched and filled second, as shown at 34B/42 in FIG. 4, but this presents no functional problems. All other layers for the stack may then be processed using the above-described single layer processing.

Figure 5:
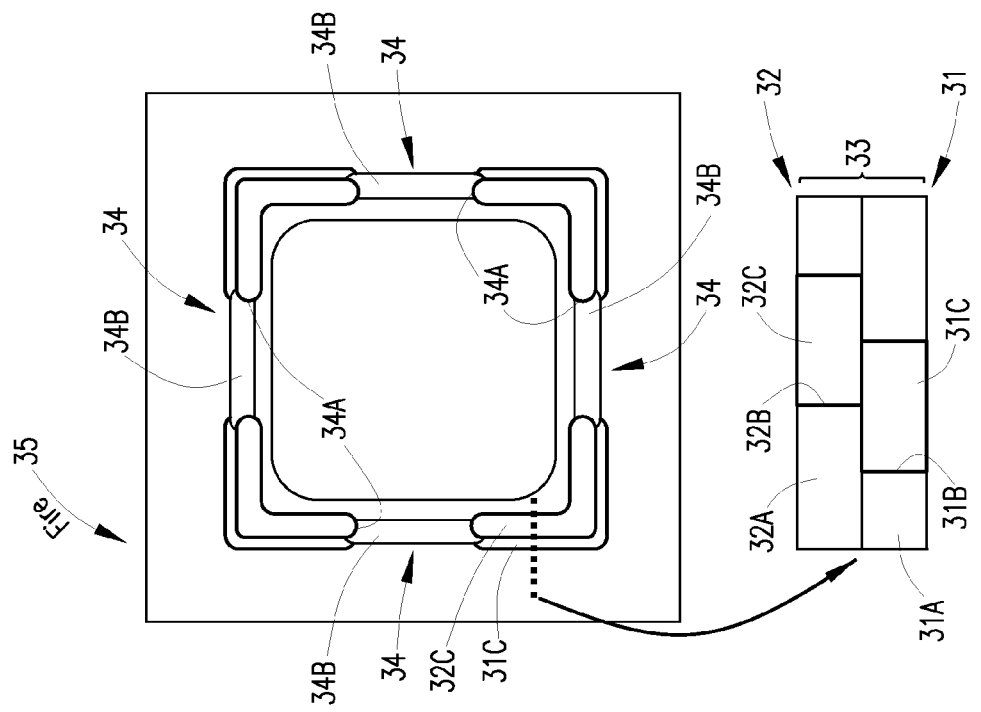
FIG. 5 diagrammatically illustrates a portion of the interior of a solid wall conductive enclosure for EMI structures according to exemplary embodiments of the invention.

FIG. 5 diagrammatically illustrates a portion of the interior of an annular solid wall conductive enclosure for EMI according to exemplary embodiments of the invention. The ceramic material inboard of the solid wall is hidden in order to show the wall. The material shown between the wall layers is either a printed conductive capture pad in the shape of a ring or a printed ground plane (also partially hidden to show the solid wall). However, these are purely optional features, because all wall segments are already electrically connected. The specific example of FIG. 5 shows a wall composed of stacked single layer annular wall portions 41 produced according to the above-described single layer processing. Also shown are the ground plane 52 and a printed thick film seal ring 51, the latter being partially cut away to show the wall portions 41 forming the interior sidewalls of the cavity. The two-layer processing of FIG. 3 also produces similar solid conductive sidewalls for the cavity.

Figure 7:
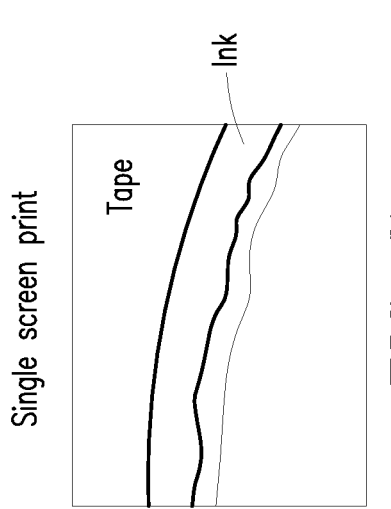
FIGS. 6-9 diagrammatically illustrate a further method of producing a solid wall conductive enclosure for EMI structures according to exemplary embodiments of the invention.
Figure 9:
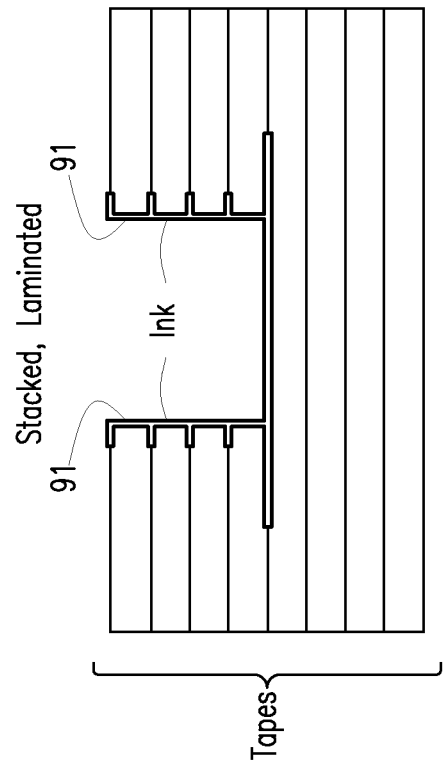
Figure 6:
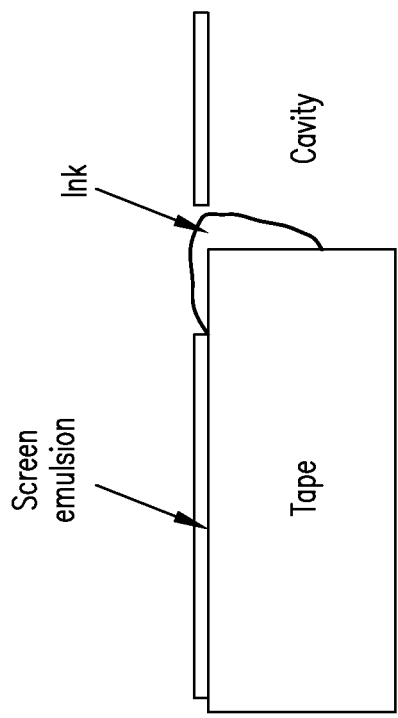
Figure 8:
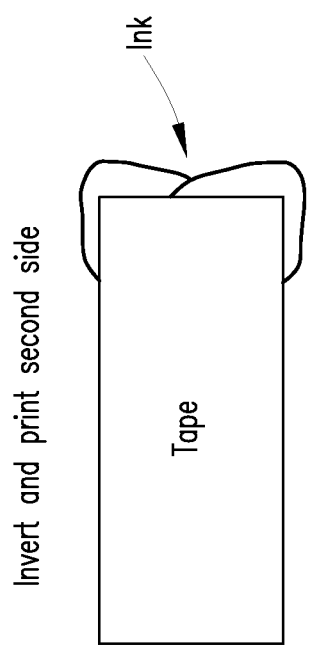

FIGS. 6-9 illustrate a further process for producing a multi-layer annular solid conductive wall for EMI. As shown in FIG. 6, a screen emulsion or stencil edge is used to stencil material containing conductor (ink in the example of FIG. 6) onto the tape layer near the edge surface of the tape that will face the cavity. In some embodiments, the stenciled material itself may not be conductive, but the ultimate fired product is. The ink runs, or flows, onto the surface of the tape (in order to provide wrapping of the EMI shield, and down the edge surface of the tape to coat more than half of that surface. This is also shown in FIG. 7, wherein the cavity 71 has a generally circular shape. Then, the tape is inverted, and the process of FIG. 6 is repeated. The result, shown in FIG. 8, is that the entire edge surface and a portion of the top and bottom surface of the tape is coated with the ink. The process of FIGS. 7 and 8 is repeated for as many tape layers as desired, and all of the tape layers are collated and laminated, to produce a substrate containing the desired annular solid conductive wall of dried ink on the interior sidewalls 91 of the cavity, as shown in the cross-sectional view of FIG. 9. The laminated layers may then be post-processed if called for in a particular design, and fired to produce an LTCC substrate.

Although exemplary embodiments have been described above in detail, this does not limit the scope of the invention, which can be practiced in a variety of embodiments.

What is claimed is:

1. A method for making a full tape thickness conductor in a plurality of dielectric tape layers, comprising:
   removing dielectric material to form a first slot through the thickness of a first said tape layer;
   filling the first slot with material comprising the conductor;
   drying the material in the first slot;
   removing dielectric material to form a second slot through the thickness of a second said tape layer;
   filling the second slot with material comprising the conductor;
   drying the material in the second slot;
   stacking said first and second tape layers to form a tape stack with said first and second slots in overlapping relationship to one another;
   removing dielectric material to form through the first and second tape layers, as already stacked in said tape stack, a third slot that contacts said first and second slots;
   filling the third slot with material comprising the conductor; and
   drying the material in the third slot.

2. The method of claim 1, including, before said stacking, performing said forming, filling and drying with respect to a plurality of pairs of said first and second slots in the respective first and second tape layers, and further including performing said forming, filling and drying with respect to a plurality of said third slots in the first and second tape layers, wherein said first, second and third slots collectively form a generally annular full tape thickness conductor in the tape stack.

3. The method of claim 2, including forming a plurality of said generally annular full tape thickness conductors in a corresponding plurality of said tape stacks, and stacking said tape stacks to form a substrate containing a generally annular solid conductive wall comprising said full tape thickness conductors.

4. The method of claim 3, including providing said wall to surround a circuit as part of an electromagnetic isolation structure.

5. The method of claim 4, including providing a ground plane and a further conductive structure adjoining respectively opposite ends of said wall in the electromagnetic isolation structure.

6. The method of claim 4, including firing the substrate to produce a low temperature co-fired ceramic structure.

7. The method of claim 1, wherein said first and second slots are laterally offset from one another in said tape stack.

8. A method for making a full tape thickness conductor in a plurality of dielectric tape layers, comprising:
    removing dielectric material to form a first slot through the thickness of a first said tape layer;
    filling the first slot with material comprising the conductor;
    drying the material in the first slot;
    stacking said first tape layer and a second said tape layer that has a ground plane disposed thereon, to form a tape stack;
    removing dielectric material to form through the first and second tape layers, as already stacked in said tape stack, a second slot that contacts the first slot and the ground plane;
    filling the second slot with material comprising the conductor; and
    drying the material in the second slot.

9. The method of claim 8, including performing said forming, filling and drying with respect to a plurality of said first slots and a plurality of said second slots to form a generally annular full tape thickness conductor in said first tape layer.

10. The method of claim 9, including providing said generally annular full tape thickness conductor as part of a solid conductive wall in an electromagnetic isolation structure surrounding a circuit.

11. A method for making a full tape thickness conductor in a dielectric tape layer, comprising:
    forming a first set of slots through the thickness of said tape layer and spaced apart from one another in said tape layer;
    filling the first set of slots with material comprising the conductor;
    drying the material in the first set of slots;
    after said forming, filling and drying, forming through the thickness of said tape layer a second set of slots that are interposed between and contact respectively associated spaced apart pairs of the first set of slots;
    filling the second set of slots with material comprising the conductor; and
    drying the material in the second set of slots.

12. The method of claim 11, wherein the dried material in said first and second slots forms a generally annular full tape thickness conductor in said tape layer.

13. The method of claim 12, including forming a plurality of said generally annular full tape thickness conductors in a corresponding plurality of tape layers, and stacking said tape layers to form a substrate having therein a generally annular solid conductive wall comprising said full tape thickness conductors.

14. The method of claim 13, including providing said wall as part of an electromagnetic isolation structure surrounding a circuit.

15. The method of claim 14, including providing a ground plane and a further conductive structure adjoining respectively opposite ends of said wall in the electromagnetic isolation structure.

16. The method of claim 14, including firing the substrate to produce a low temperature co-fired ceramic structure.

17. The method of claim 11, wherein the tape layer is a composite tape layer including at least two constituent dielectric tape layers stacked on one another.

* * * * *